United States Patent [19]

Okamura

[11] Patent Number: 5,559,451
[45] Date of Patent: Sep. 24, 1996

[54] BICMOS PUSH-PULL TYPE LOGIC APPARATUS WITH VOLTAGE CLAMP CIRCUIT AND CLAMP RELEASING CIRCUIT

[75] Inventor: Hitoshi Okamura, Tokyo, Japan

[73] Assignee: NEC Corporation, Tokyo, Japan

[21] Appl. No.: 528,647

[22] Filed: Sep. 7, 1995

[30] Foreign Application Priority Data

Sep. 8, 1994  [JP]  Japan ................................. 6-214835

[51] Int. Cl.$^6$ ................................................. H03K 19/08
[52] U.S. Cl. ............................ 326/84; 326/18; 326/110; 327/375
[58] Field of Search ........................... 326/17–18, 21, 326/84–85, 109–110, 89–91, 125; 327/375, 313, 324

[56] References Cited

U.S. PATENT DOCUMENTS

| | | | |
|---|---|---|---|
| 4,845,386 | 7/1989 | Ueno | 326/110 |
| 4,897,564 | 1/1990 | Chen | 326/84 |
| 5,025,456 | 6/1991 | Ota et al. | |
| 5,038,058 | 8/1991 | Wang | 326/84 |
| 5,107,143 | 4/1992 | Ueno et al. | 326/84 |
| 5,254,885 | 10/1993 | Ando | 326/85 |

FOREIGN PATENT DOCUMENTS 3-295314  12/1991  Japan.
7-95045   4/1995   Japan.

OTHER PUBLICATIONS by T. Hagano et al., "What can Replace BiCMOS at Lower Supply Voltage Regime?", *IEEE IEDM 92*, pp. 393–396, 1992.

*Primary Examiner*—Edward P. Westin
*Assistant Examiner*—Jon Santamauro
*Attorney, Agent, or Firm*—Young & Thompson

[57] ABSTRACT

In a push-pull type logic apparatus including a push-pull buffer formed by two bipolar transistors, a control circuit for turning ON one of the bipolar transistors and turning OFF the other, and a voltage clamp circuit for clamping the voltage of the base of at least one of the bipolar transistors, a clamp releasing circuit is provided for releasing the clamp operation of the voltage clamp circuit when the corresponding bipolar transistor is turned ON. Also, a MOS transistor is connected between the collector and emitter of the corresponding bipolar transistor and is turned ON when the corresponding bipolar transistor is turned ON.

29 Claims, 14 Drawing Sheets

PRIOR ART

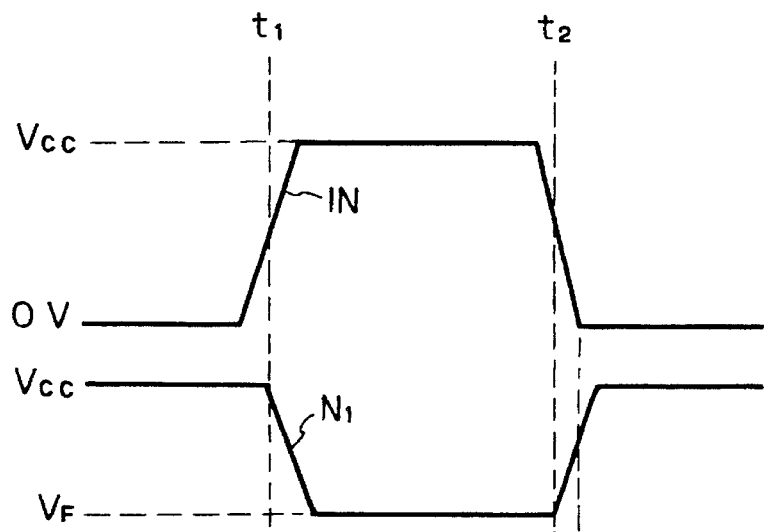
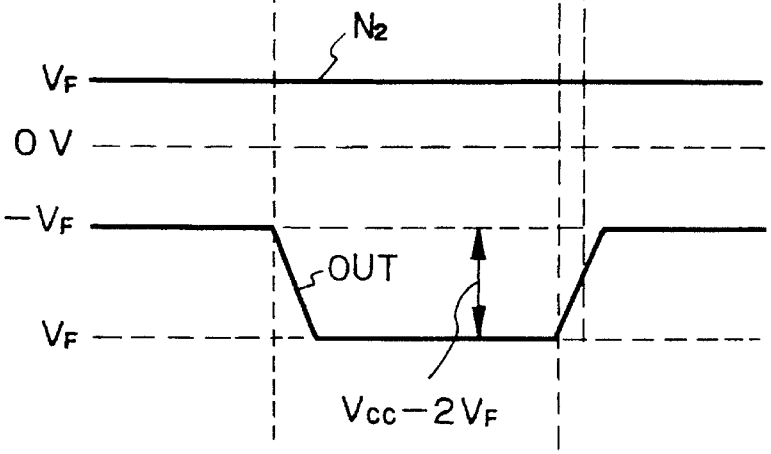
Fig. 4A
Fig. 4B
Fig. 4C
Fig. 4D

BICMOS PUSH-PULL TYPE LOGIC APPARATUS WITH VOLTAGE CLAMP CIRCUIT AND CLAMP RELEASING CIRCUIT

BACKGROUND OF THE INVENTION

1. Filed of the Invention

The present invention relates to a bipolar complementary metal oxide semiconductor (BiCMOS) push-pull type logic apparatus incorporating a voltage clamp circuit.

2. Description of the Related Art

A prior art BiCMOS push-pull type logic apparatus such as an inverter includes a push-pull buffer formed by two NPN type transistors, and a CMOS control circuit for controlling the bases of the NPN type transistors in response to an input voltage. That is, one of the NPN type transistors is turned ON, while the other is turned OFF, and accordingly, an output voltage of the push-pull buffer is changed in accordance with the input voltage. This will be explained later in detail.

In the above-described prior art BiCMOS push-pull type logic apparatus, however, before each of the NPN type transistors is turned ON, the voltage at the base thereof remains at a ground level. Therefore, in order to turn ON each of the NPN type transistors, first, a parasitic capacitance thereof has to be charged, which reduces the operation speed. In this case, the driving power of the CMOS control circuit is made large so as to increase the operation speed.

In order to compensate for the reduction of the operation speed, the inventor has already proposed that a voltage clamp circuit is provided at the base of each of the NPN transistors, to clamp the voltage at the base of each of the NPN transistors before turning ON the NPN transistors (see Japanese Patent Application No. 5-237620 filed on Sep. 24, 1993 and published as Kokai No. HEI7-95045 on Apr. 7, 1995). This will be explained later in detail.

In the above-proposed BiCMOS push-pull type logic apparatus, however, the output voltage swing is so small that it is impossible to operate the logic apparatus under a low power supply voltage system.

SUMMARY OF THE INVENTION

It is an object of the present invention to provide a push-pull type logic apparatus incorporating a voltage clamp circuit and having a large output voltage swing.

According to the present invention, in a push-pull type logic apparatus including a push-pull buffer formed by two bipolar transistors, a control circuit for turning ON one of the bipolar transistors and turning OFF the other, and a voltage clamp circuit for clamping the voltage of the base of at least one of the bipolar transistors, a clamp releasing circuit is provided for releasing the clamp operation of the voltage clamp circuit when the corresponding bipolar transistor is turned ON. Also, a MOS transistor is connected between the collector and emitter of the corresponding bipolar transistor and is turned ON when the corresponding bipolar transistor is turned ON. Thus, the output voltage swing can be increased.

BRIEF DESCRIPTION OF THE DRAWINGS

The present invention will be more clearly understood from the description as set forth below, in comparison with the prior art, with reference to the accompanying drawings, wherein:

FIGS. 4A, 4B, 4C and 4D are timing diagrams for explaining the operation of the apparatus of FIG. 3;

DESCRIPTION OF THE PREFERRED EMBODIMENTS

Before the description of the preferred embodiments, a prior art BiCMOS push-pull type logic apparatus and a proposed BiCMOS push-pull type logic apparatus will be explained with reference to FIGS. 1 and 2, and FIGS. 3A, 3B and 3C.

Figure 1:
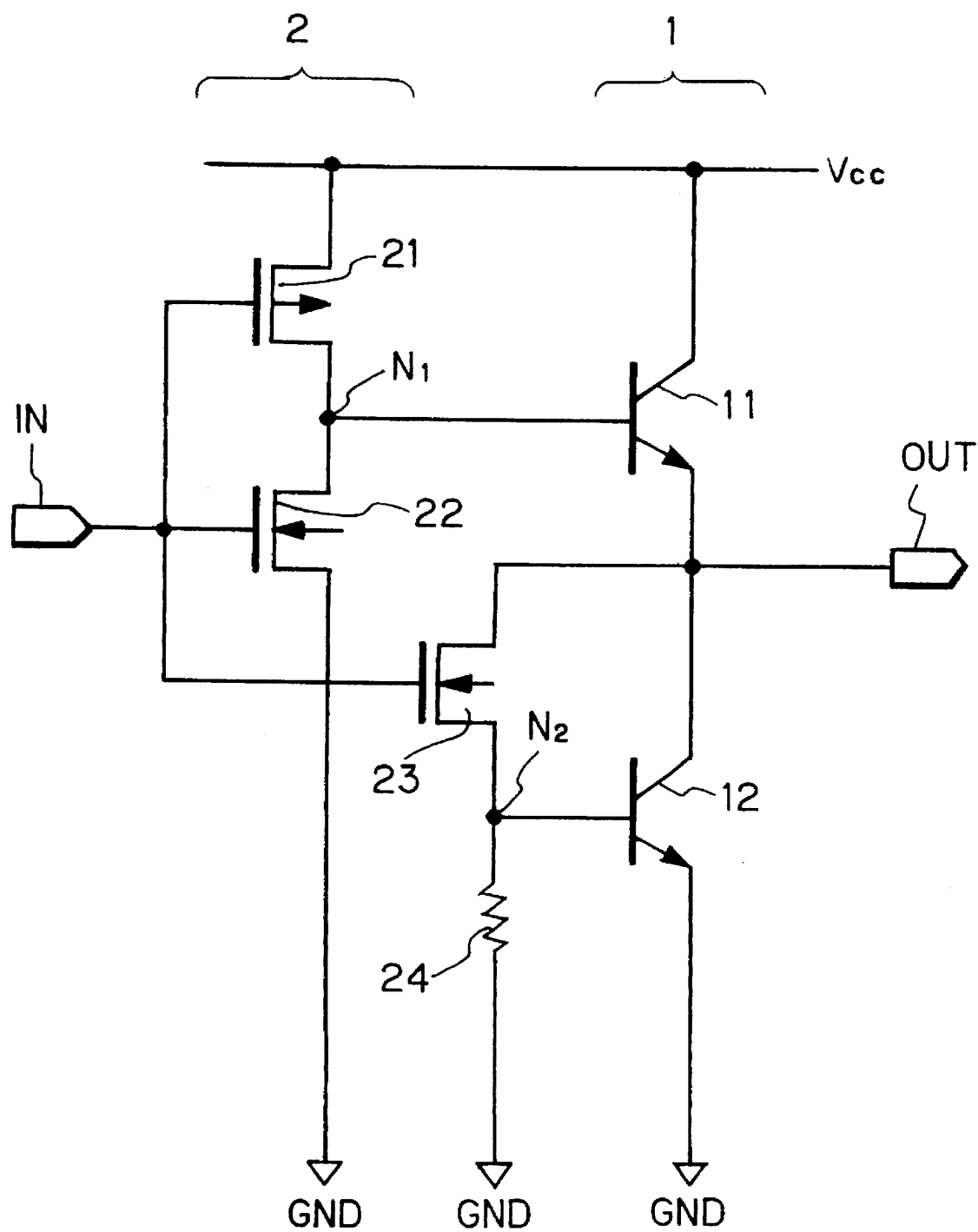
FIG. 1 is a circuit diagram illustrating a prior art BiCMOS push-pull type logic apparatus.

In FIG. 1, which illustrates a prior art BiCMOS push-pull type logic apparatus, a push-pull buffer 1 formed by NPN type transistors 11 and 12 is connected between a high power supply voltage terminal $V_{cc}$ and a low power supply terminal GND. In more detail, a collector of the NPN type transistor 11 is connected to the high power supply terminal $V_{cc}$, and an emitter of the NPN type transistor 11 is connected to an output terminal OUT. Also, a collector of the NPN type transistor 12 is connected to the output terminal OUT, and an emitter of the NPN type transistor 12 is connected to the low power supply terminal GND.

A control circuit 2 receives an input voltage at an input terminal IN to control bases of the NPN type transistors 11 and 12. The control circuit 2 includes a P-channel MOS transistor 21, an N-channel MOS transistor 22, an N-channel MOS transistor 23, and a resistor 24. That is, the P-channel MOS transistor 21 supplies a current to the base of the NPN type transistor 11, to turn ON the NPN type transistor 11, while the N-channel transistor 22 absorbs a current from the base of the NPN type transistor 11, to turn OFF the NPN type transistor 11. Similarly, the N-channel MOS transistor 23 supplies a current to the base of the NPN type transistor 12, to turn ON the NPN type transistor 12, while the resistor 24 absorbs a current from the base of the NPN type transistor 12, to turn OFF the NPN type transistor 12.

The operation of the apparatus of FIG. 1 is explained next with reference to FIGS. 2A, 2B, 2C and 2D.

Figures 2A, 2B, 2C, 2D:
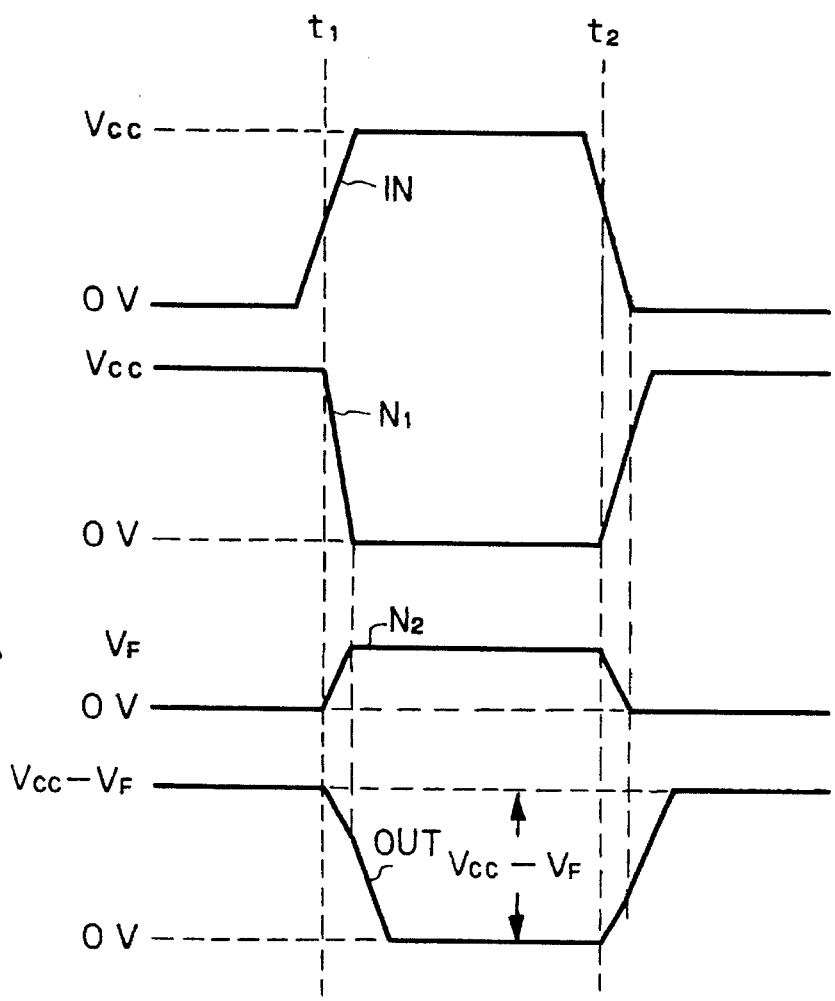
FIGS. 2A, 2B, 2C and 2D are timing diagrams for explaining the operation of the apparatus of FIG. 1.

At time $t_1$, when the voltage at the input terminal IN is changed from low (=0 V) to high (= $V_{cc}$), as shown in FIG. 2A, the MOS transistors 21 and 22 are turned OFF and ON, respectively, so that the voltage at the output terminal OUT is decreased with the reduction of the voltage at a node $N_1$, i.e., the base of the NPN type transistor 11, as shown in FIGS. 2B and 2D. In this case, the difference in potential between the base of the NPN hype transistor 11 and the output terminal OUT is a forward voltage $V_F$ of the PN junction of the NPN type transistor 11. Simultaneously, the MOS transistor 23 is turned ON to charge the base parasitic capacitance of the NPN type transistor 12, so that the voltage at a node $N_2$, i.e., the base of the NPN type transistor 12 rises at $V_F$, as shown in FIG. 2C. As a result, as shown in FIG. 2D, the voltage at the output terminal OUT is remarkably reduced at 0 V.

At time $t_2$, when the voltage at the input terminal IN is changed from high to low, as shown in FIG. 2A, the MOS transistors 21 and 22 are turned ON and OFF, respectively, to charge the base parasitic capacitance of the NPN type transistor 11. As a result, when the voltage at the node N, reaches $V_F$ as shown in FIG. 2B, the NPN transistor 11 is turned ON, so that the voltage at the output terminal OUT is increased with the increase of the voltage at the base of the NPN type transistor 11, as shown in FIG. 2D. Also, in this case, the difference in potential between the base of the NPN type transistor 11 and the output terminal OUT is the forward voltage $V_F$ of the PN junction of the NPN type transistor 11. Simultaneously, the MOS transistor 23 is turned OFF to cut off the base current of the NPN transistor 12. As a result, the charges at the node $N_2$ are discharged through the resistor 24 as shown in FIG. 2C, so that the voltage at the node $N_2$, i.e., the base of the NPN type transistor 12 falls to 0 V, as shown in FIG. 2C. As a result, the voltage at the output terminal OUT is remarkably increased at $V_{cc}-V_F$, as shown in FIG. 2D.

Thus, in the logic apparatus of FIG. 1, since a charging operation is performed upon the base of the NPN transistor 12 or 11 each time after the voltage at the input terminal IN is changed from low to high or vice versa. This reduces the operation speed.

Figure 3:
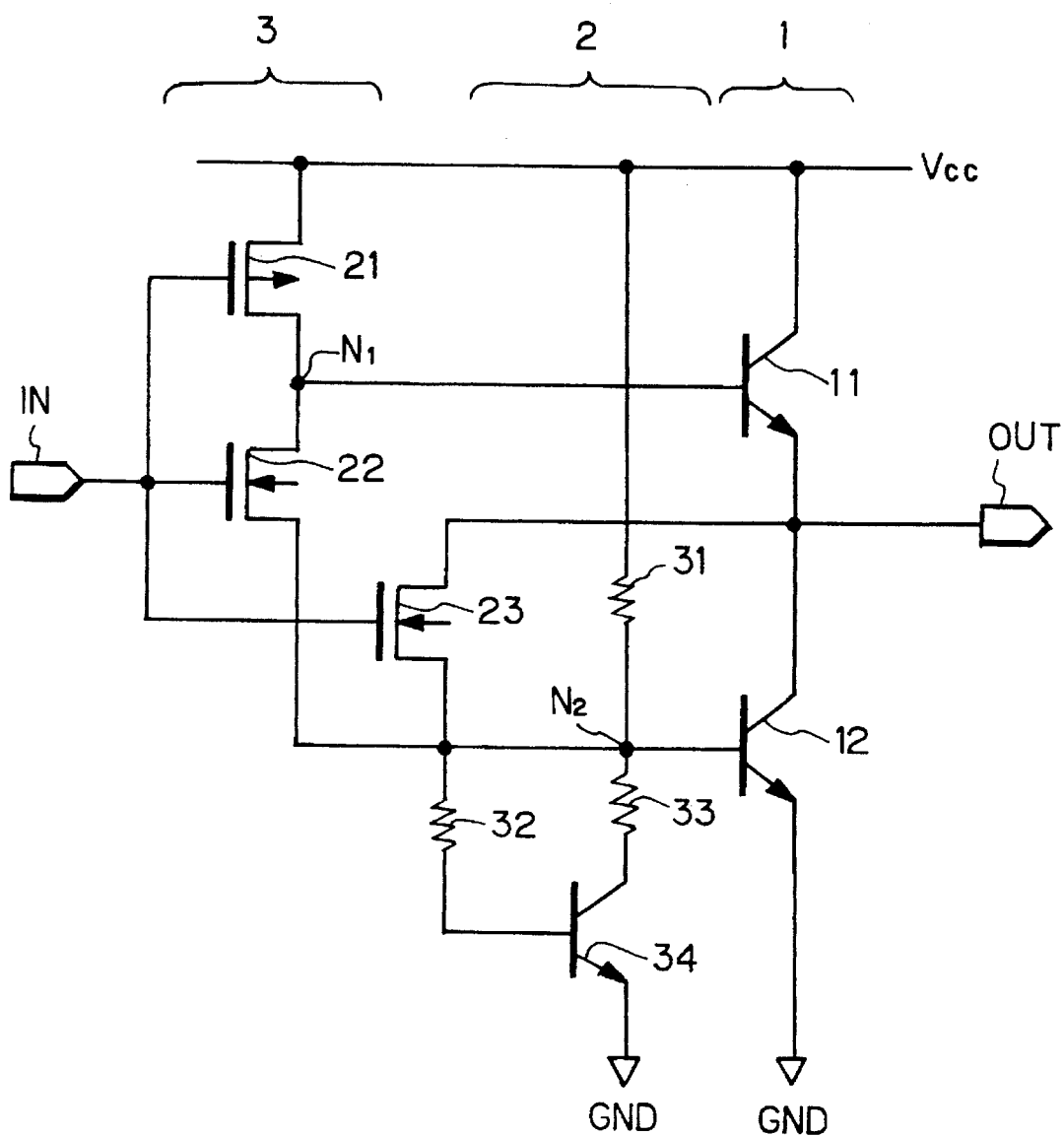
FIG. 3 is a circuit diagram illustrating a prior art BiCMOS push-pull type logic apparatus.

In FIG. 3, which illustrates a proposed BiCMOS push-pull type logic apparatus (see Japanese Patent Application No. 5-237620), a voltage clamp circuit 3 is added to the elements of the apparatus of FIG. 1, to clamp the voltage at the node $N_2$ at $V_F$. The voltage clamp circuit 3 includes resistors 31, 32 and 33, and an NPN type transistor 34. Note that the resistor 24 of FIG. 1 is not provided.

In the voltage clamp circuit 3, in a steady mode, a current flowing through the NPN type transistor 34 is determined by the resistor 31. For example, the value of the resistor 31 is set so as to satisfy that this current is less than 100 μA. In this case, since a base current of the NPN type transistor 34 is a few μA, the voltage reduction of the resistor 32, whose value is a few kΩ, is negligible. Therefore, the base voltage of the NPN type transistor 12 is substantially clamped at that of the NPN transistor 34. Also, when the voltage at the input terminal IN is high, the MOS transistor 22 is turned ON, so that the base voltage of the NPN type transistor 11 is substantially clamped at that of the NPN transistor 34.

Also, the voltage clamp circuit 3 has a higher impedance than an impedance of the base and emitter of the NPN type transistor 12. That is, when the voltage at the input terminal IN is high, so that the MOS transistors 22 and 23 are turned ON, the ON currents therefrom are shunt into both the NPN type transistors 12 and 34. In this case, the resistors 32 and 33 restrict the currents from being supplied to the NPN type transistor 34.

The operation of the apparatus of FIG. 3 is explained next with reference to FIGS. 4A, 4B, 4C and 4D.

At time $t_1$, when the voltage at the input terminal IN is changed from low to high, as shown in FIG. 4A, the MOS transistors 21 and 22 are turned OFF and ON, respectively, so that the voltage at the output terminal OUT is decreased with the reduction of the voltage at the node $N_1$, i.e., of the NPN type transistor 11, as shown in FIGS. 4B and 4D. In this case, the difference in potential between the base of the NPN type transistor 11 and the output terminal OUT is the forward voltage $V_F$ of the PN junction of the NPN type transistor 11. Simultaneously, the MOS transistor 23 is turned ON. In this case, however, the base parasitic capacitance of the NPN type transistor 12, is already charged. In other word, the voltage at the node $N_2$, i.e., the base of the NPN type transistor 12 is fixed at $V_F$, as show in FIG. 4C. As a result, as shown in FIG. 4D, since it is unnecessary to charge the base of the NPN type transistor 12, the voltage at the output terminal OUT is remarkably reduced at $V_F$.

At time $t_2$, when the voltage at the input terminal IN is changed from high to low, as shown in FIG. 4A, the MOS transistors 21 and 22 are turned ON and OFF, respectively, to charge the base parasitic capacitance of the NPN type transistor 11. As a result, when the voltage at the node N, reaches $2V_F$ as shown in FIG. 4B, the NPN transistor 11 is turned ON, so that the voltage at the output terminal OUT is increased with the increase of the voltage at the base of the NPN type transistor 11, as shown in FIG. 4D. Also, in this case, the difference in potential between the base of the NPN type transistor 11 and the output terminal OUT is the forward voltage $V_F$ of the PN junction of the NPN type transistor 11. Simultaneously, the MOS transistor 23 is turned OFF to cut off the base current of the NPN transistor 12. In this case, however, the voltage at the node $N_2$ is clamped at $V_F$ as shown in FIG. 4C. As a result, the voltage at the output terminal OUT is increased to $V_{cc}-V_F$ as shown in FIG. 4D.

In the logic apparatus of FIG. 3, however, when the voltage at the input terminal IN is high, the voltage at the output terminal OUT cannot be 0 V due to the presence of the voltage clamp circuit 3. Since the voltage clamp circuit 3 clamps the voltage at the node $N_2$ at $V_F$, the voltage at the output terminal OUT should be about $V_F$ above the ground voltage GND, to avoid the saturation of the NPN transistor 12. As a result, the output voltage swing (= $V_{cc}-2V_F$) is smaller than that (= $V_{cc}-V_F$) of the apparatus of FIG. 1. In order to obtain an output voltage swing of 0.5 V, if $V_F$=0.8 V, then a minimum value of the power supply voltage $V_{cc}$ is 2.1 V, which is not suitable for a low power supply voltage system.

Figure 5:
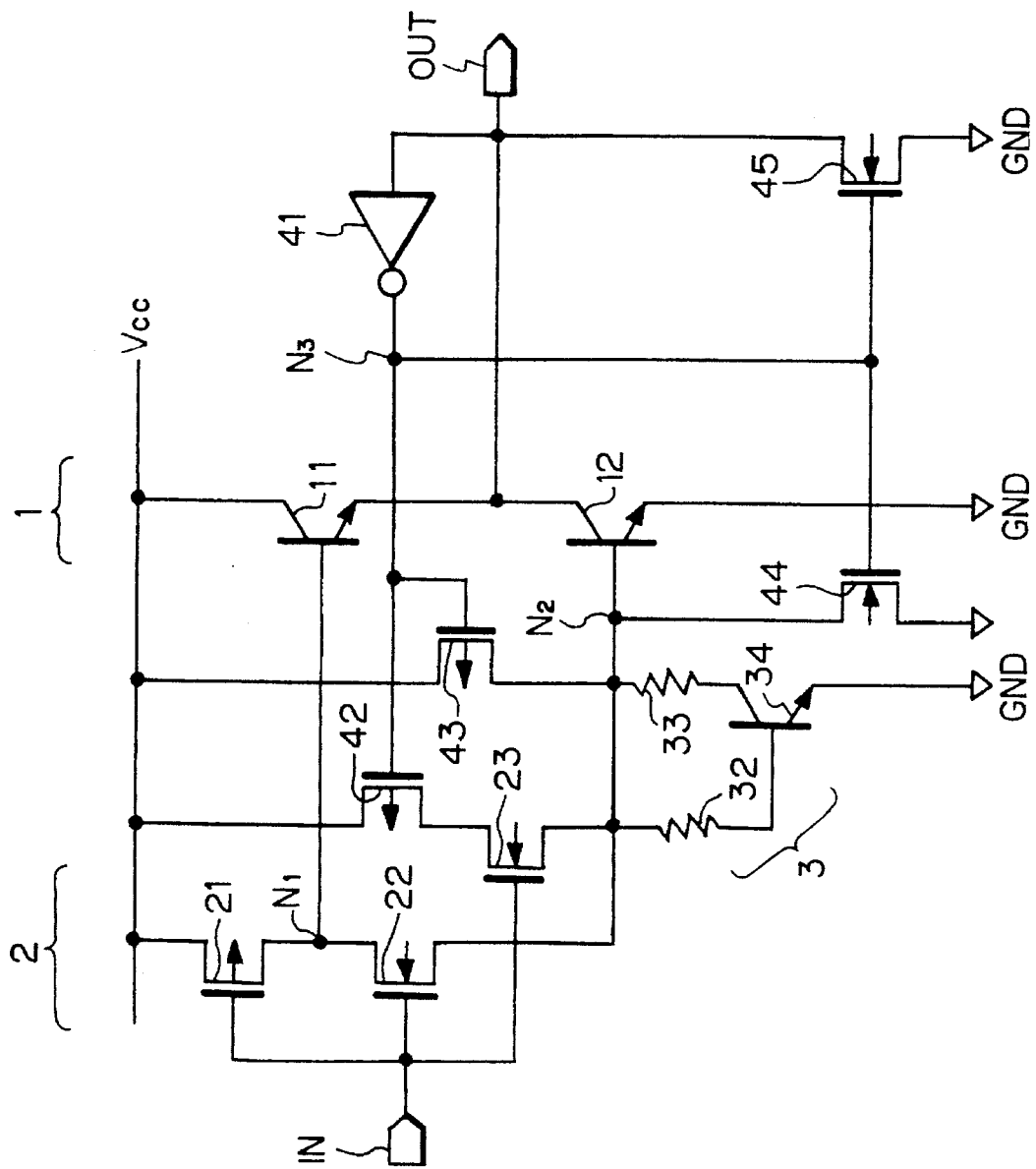
FIG. 5 is a circuit diagram illustrating a first embodiment of the BiCMOS push-pull type logic apparatus according to the present invention.

In FIG. 5, which illustrates a first embodiment of the present invention a CMOS inverter 41, P-channel MOS transistors 42 and 43, and N-channel MOS transistors 44 and 45 are added to the elements of FIG. 3. In this case, the MOS transistor 43 also serves as the resistor 31 of FIG. 3, and therefore, the resistor 31 of FIG. 3 is not provided in FIG. 5. Also, the MOS transistor 23 is connected via the MOS transistor 42 to the power supply terminal $V_{cc}$.

The CMOS inverter 41 is formed by a P-channel MOS transistor and an N-channel MOS transistor (not shown). When the voltage at the output terminal OUT is low, the voltage at a node $N_3$, i.e., the output of the CMOS inverter 41 is high (= $V_{cc}$), while when the voltage at the output terminal OUT is high, the voltage at the node $N_3$ is low (=0 V).

The MOS transistors 42 and 43 are used for releasing the voltage clamp circuit 3 when the voltage at the node $N_3$ is high. Also, the MOS transistor 44 is used for clamping the voltage at the node $N_1$ at the ground level GND when the voltage at the node $N_3$ is high. Further, the MOS transistor 45 is used for clamping the voltage at the output terminal OUT at the ground level GND when the voltage at the node $N_3$ is high.

The operation of the apparatus of FIG. 5 is explained next with reference to FIGS. 6A, 6B, 6C, 6D and 6E.

Figure 6A:
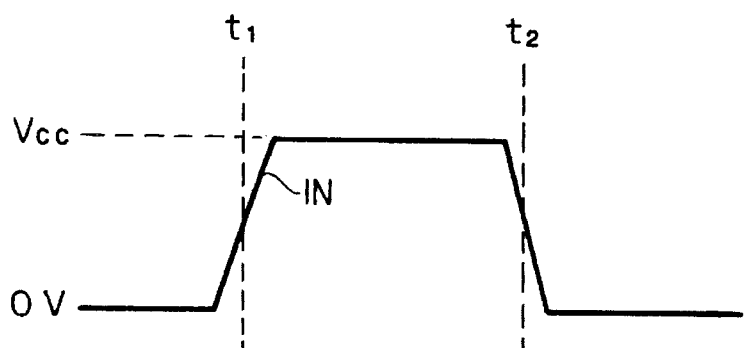
FIGS. 6A, 6B, 6C, 6D and 6E are timing diagrams for explaining the operation of the apparatus of FIG. 5.
Figure 6B:
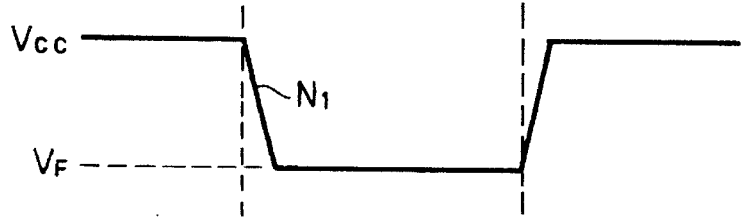
Figure 6C:
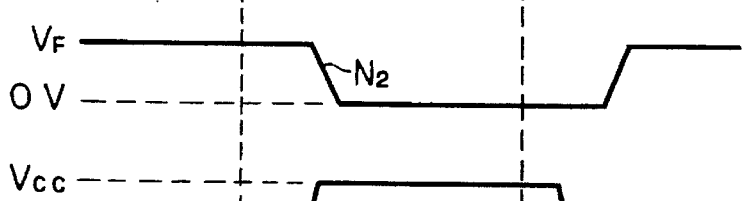
Figure 6D:
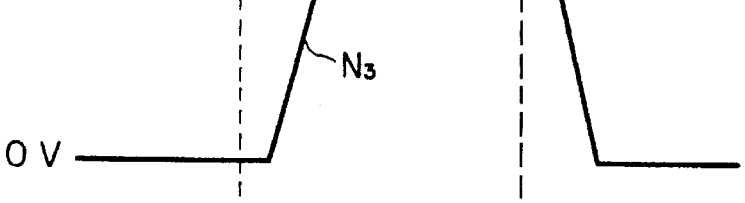
Figure 6E:
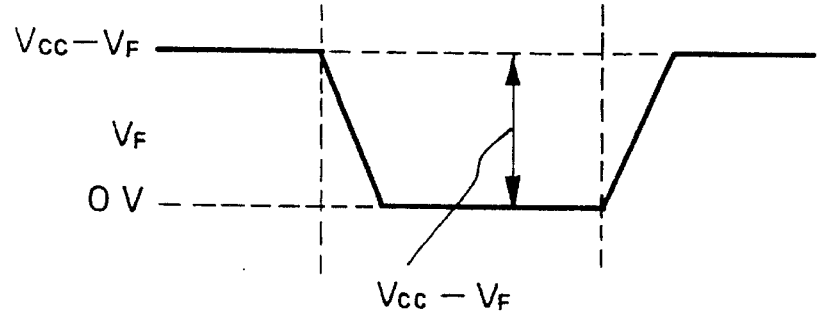

Before time $t_1$, the voltage at the output terminal OUT is high ($= V_{cc}-V_F$) as shown in FIG. 6E, and therefore, the voltage at the node $N_3$ is low ($= 0$ V), as shown in FIG. 6D. As a result, the MOS transistors 42 and 43 are turned ON, and the MOS transistors 44 and 45 are turned OFF.

At time $t_1$, when the voltage at the input terminal IN is changed from low to high, as shown in FIG. 6A, the MOS transistors 21 and 22 are turned OFF and ON, respectively, so that the voltage at the output terminal OUT is decreased with the reduction of the voltage at the node $N_1$, i.e., the base of the NPN type transistor 11, as shown in FIGS. 6B and 6E. In this case, the difference in potential between the base of the NPN type transistor 11 and the output terminal OUT is the forward voltage $V_F$ of the PN junction of the NPN type transistor 11. Simultaneously, the MOS transistor 23 is turned ON. In this case, however, the base parasitic capacitance of the NPN type transistor 12, is already charged, in other word, the voltage at the node $N_2$, i.e., the base of the NPN type transistor 12 is fixed at $V_F$, as shown in FIG. 6C. As a result, as shown in FIG. 6E, since it is unnecessary to charge the base of the NPN type transistor 12, the voltage at the output terminl OUT is remarkably reduced.

On the other hand, when the voltage at the output terminal OUT is reduced as shown in FIG. 6E, the voltage at the output terminal OUT is increased as shown in FIG. 6D. As a result, the MOS transistors 42 and 43 are turned OFF, so that the operation of the clamp circuit 3 is inhibited. Simultaneously, the MOS transistor 44 is turned ON, so that the NPN type transistors 12 and 34 are completely turned OFF. Thus, the saturation of the NPN type transistor 12 is dissolved. Further, although the turning OFF of the NPN type transistor 12 seems to put the output terminal OUT in a floating state, since the MOS transistor 45 is turned ON, the voltage at the output terminal OUT is surely reduced to 0 V.

At time $t_2$, when the voltage at the input terminal IN is changed from high to low, as shown in FIG. 6A, the MOS transistors 21 and 22 are turned ON and OFF, respectively, to charge the base parasitic capacitance of the NPN type transistor 11. As a result, when the voltage at the node $N_1$ reaches $V_F$ as shown in FIG. 6B, the NPN transistor 11 is turned ON, so that the voltage at the output terminal OUT is increased with the increase of the voltage at the base of the NPN type transistor 11, as shown in FIG. 6E. Also, in this case, the difference in potential between the base of the NPN type transistor 11 and the output terminal OUT is the forward voltage $V_F$ of the PN junction of the NPN type transistor 11. In this case, the MOS transistors 42 and 43 are turned ON; however, the MOS transistor 23 is turned OFF to cut off the base current of the NPN transistor 12. Therefore, the voltage at the node $N_2$ is clamped at $V_F$ as shown in FIG. 4C. In this case, note that a current of about 50 μA flows through each of the NPN type transistors 12 and 34. As a result, the voltage at the output terminal OUT is increased to $V_{cc}-V_F$ as shown in FIG. 6E.

Thus, in the logic apparatus of FIG. 5, when the voltage at the input terminal IN is high, the voltage at the output terminal OUT can be 0 V since the voltage clamp circuit 3 is released. As a result, the output voltage swing ($=V_{cc}-V_F$) is same as that the of the apparatus of FIG. 1. In order to obtain an output voltage swing of 0.5 V, if $V_F=0.8$ V, then a minimum value of the power supply voltage $V_{cc}$ is 1.3 V, which is sufficiency suitably for a low power supply voltage system.

Figure 7A:
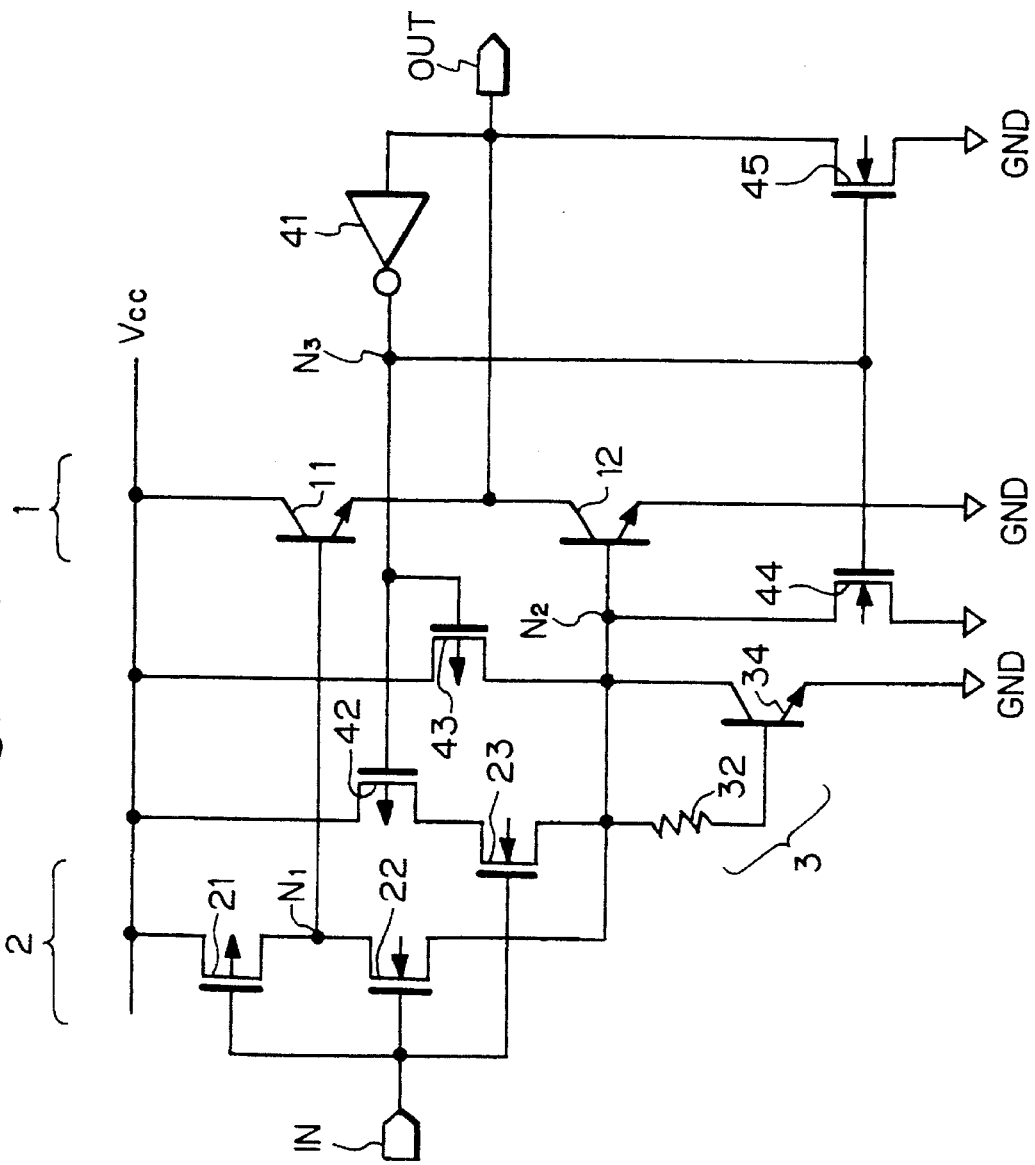
FIGS. 7A, 7B and 7C are circuit diagrams illustrating modifications of the apparatus of FIG. 5.
Figure 7B:
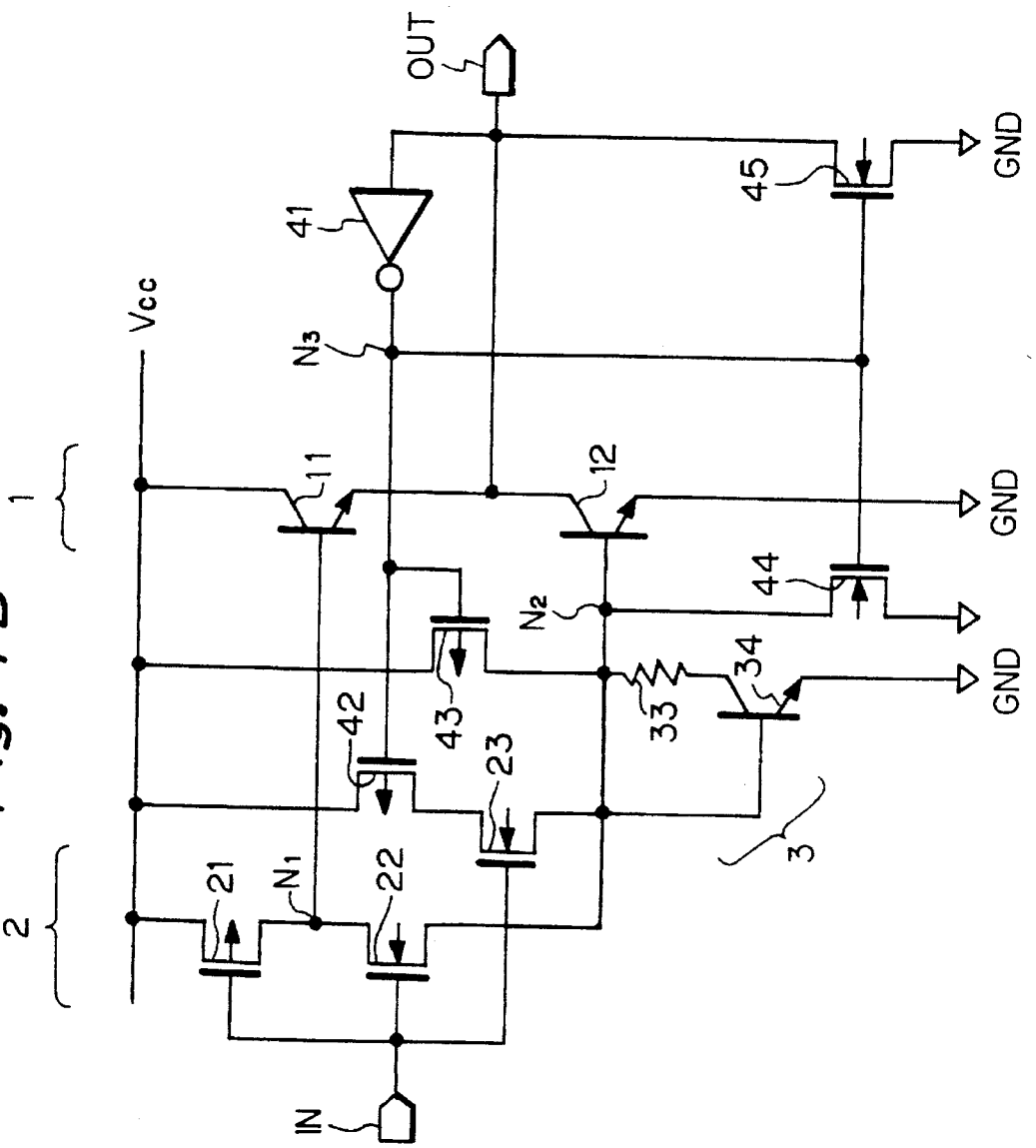
Figure 7C:
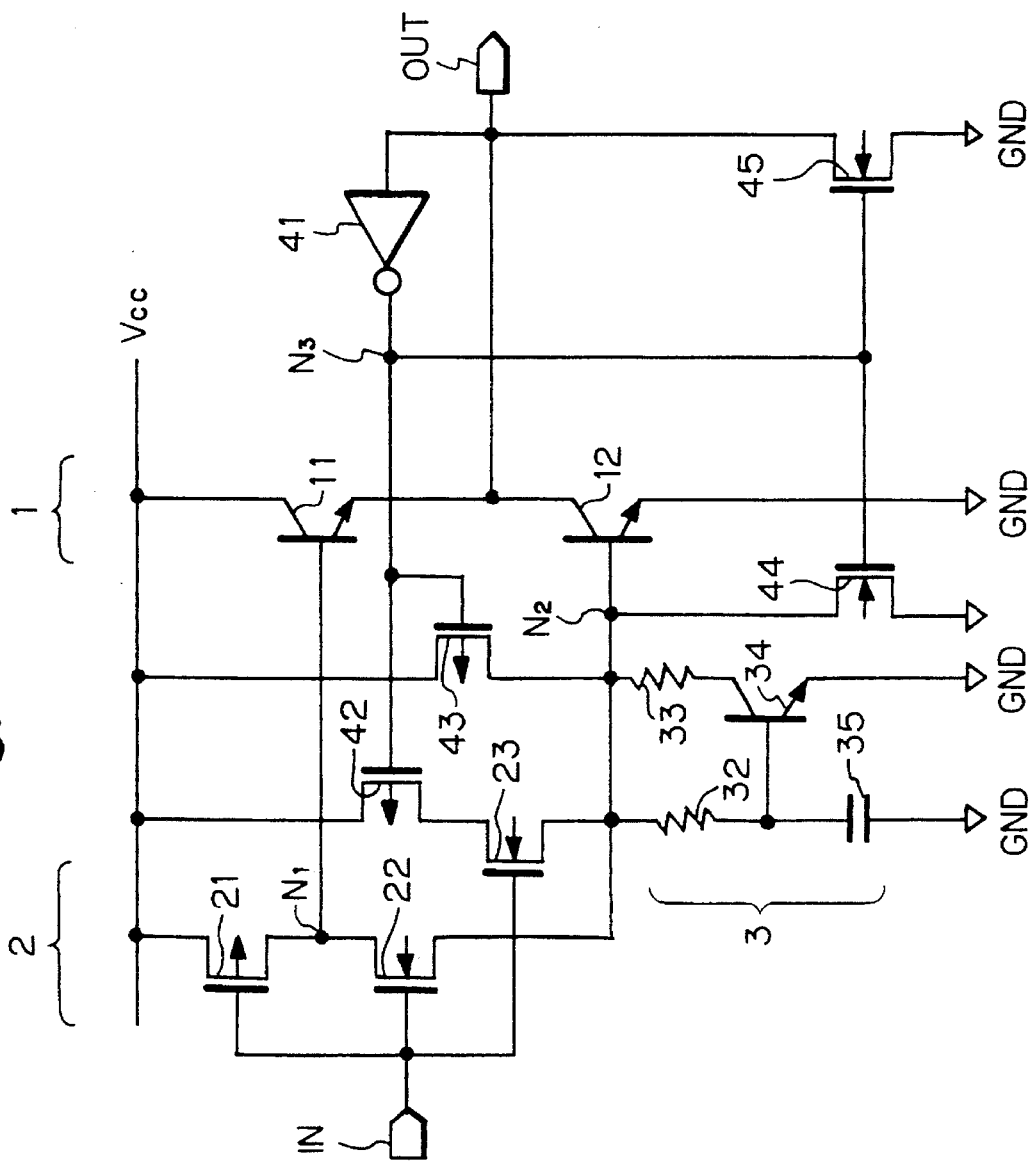

In FIGS. 7A, 7B and 7C, the voltage clamp circuit 3 of FIG. 5 is modified. In FIG. 7A, the resistor 33 of FIG. 5 is omitted, and in FIG. 7B, the resistor 32 is omitted. Also, in FIG. 7C, a capacitor 35 is added. That is, at least one of the resistors 32 and 33 has only be present, so as to increase an impedance in view of the node $N_2$.

Figure 8:
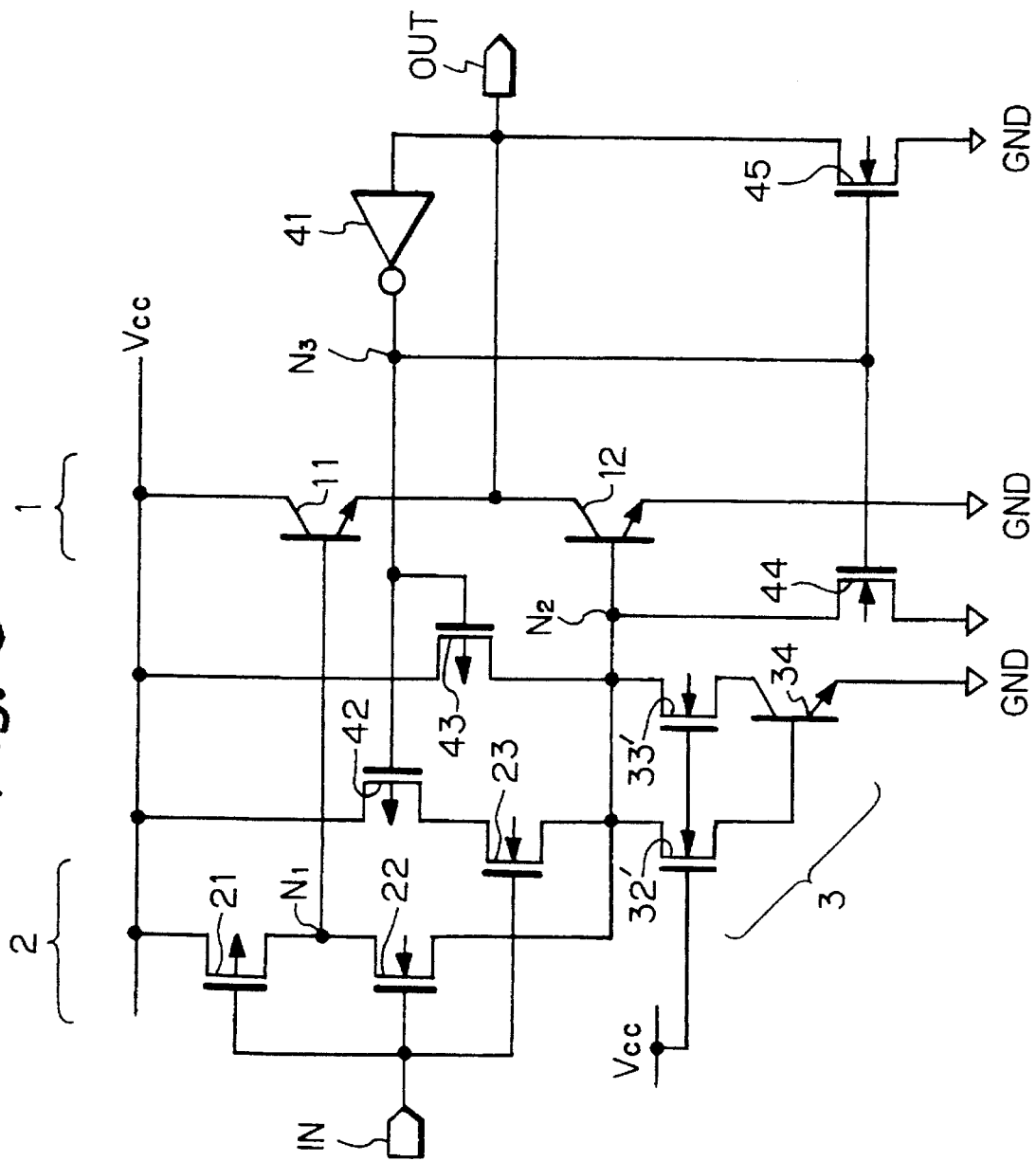
FIG. 8 is a circuit diagram illustrating another modification of the apparatus of FIG. 5.

In FIG. 8, which illustrates a modification of the apparatus of FIG. 5, the resistors 32 and 33 of FIG. 5 are replaced by ON state N-channel MOS transistors 32' and 33', respectively, thus increasing the integration of the apparatus of FIG. 8 as compared with that of FIG. 5.

Figure 9:
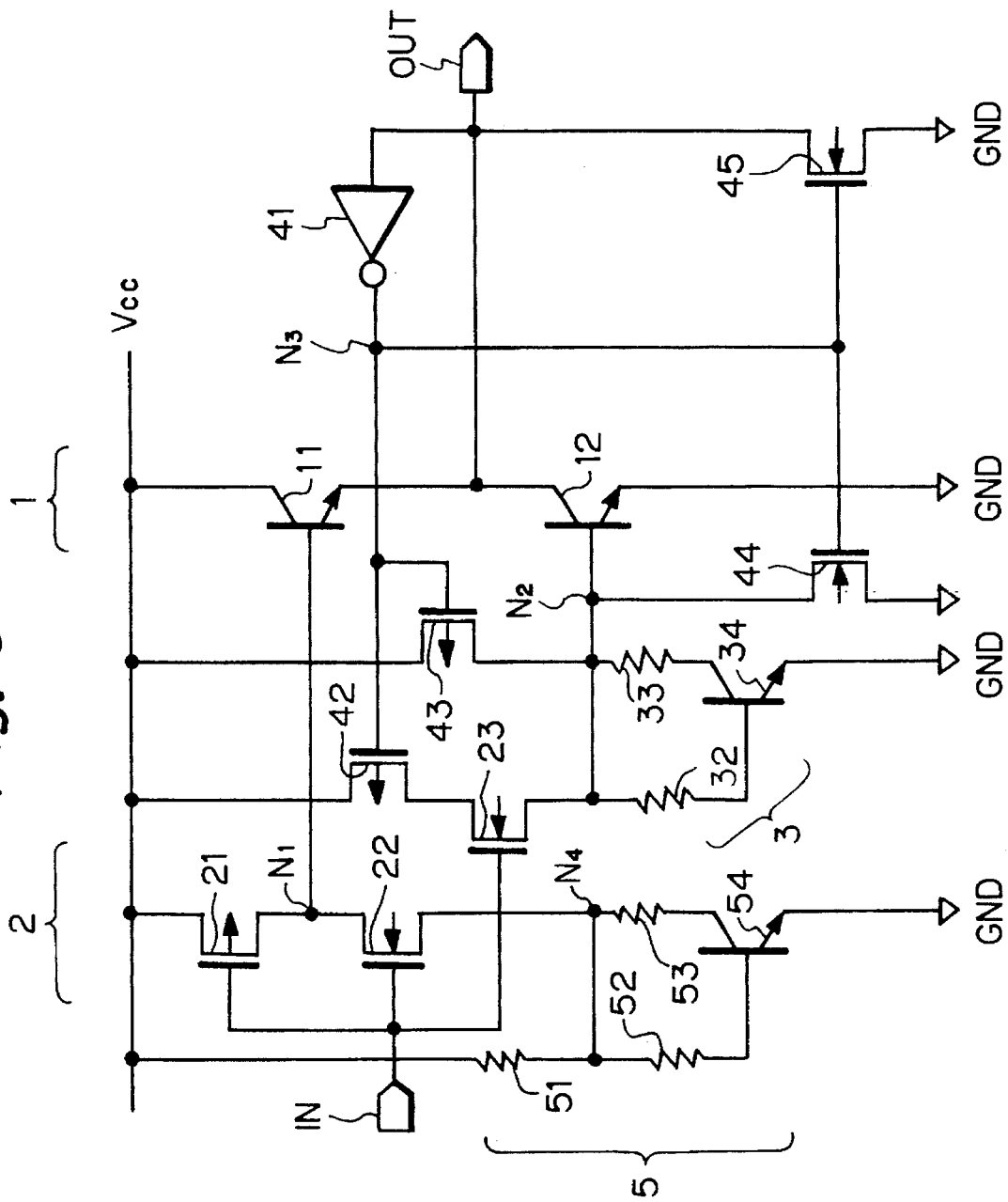
FIG. 9 a circuit diagram illustrating a second embodiment of the BiCMOS push-pull type logic apparatus according to the present invention.

In FIG. 9, which illustrates a second embodiment of the present invention, another voltage clamp circuit 5 formed by resistors 51, 52 and 53, and an NPN type transistor 54 is added to the elements of FIG. 5. In FIG. 5, the voltage clamp circuit 3 can clamp the base voltage of the NPN type transistor 11 at the voltage $V_F$ in addition to the base voltage of the NPN type transistor 12. Conversely, in FIG. 9, the voltage clamp circuit 3 clamps the base voltage of the NPN type transistor 12 at the voltage $V_F$, while the voltage clamp circuit 5 clamps the base voltage of the NPN type transistor 11 at $V_{cc}-V_F$. That is, since the collector of the NPN type transistor 11 is connected to the power supply terminal $V_{cc}$, the NPN type transistor 11 cannot be operated in a saturated state. Therefore, when the base voltage of the NPN type transistor 11 is clamped at $V_{cc}-V_F$, the NPN type transistor 11 can be rapidly turned ON when the voltage at the input terminal IN is low.

Figure 10:
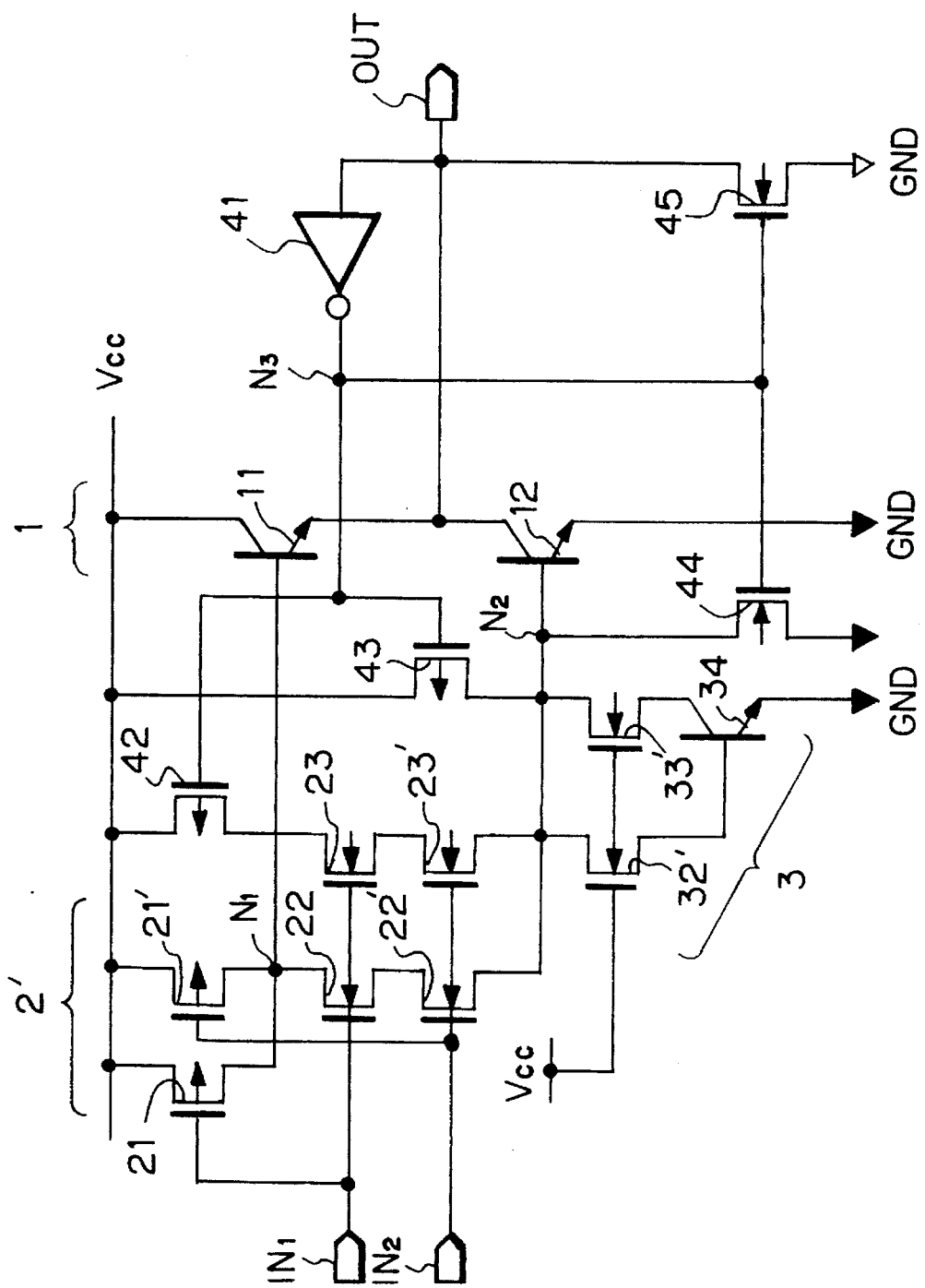
FIG. 10 is a circuit diagram illustrating a NAND logic apparatus to which the first embodiment of the present invention is applied.

FIG. 10 is a circuit diagram illustrating a NAND logic apparatus to which the first embodiment as illustrated in FIG. 8 is applied. That is, a CMOS control circuit 2' includes p-channel MOS transistors 21 and 21' in parallel between the power supply terminal $V_{cc}$ and the node $N_1$, N-channel MOS transistors 22 and 22' in series between the nodes $N_1$ and $N_2$, and N-channel MOS transistors 23 and 23' in series between the MOS transistor 42 and the node $N_2$. The MOS transistors 21 to 23 are controlled by a voltage at an input terminal $IN_1$, and the MOS transistors 21' and 23' are controlled by a voltage at an input terminal $IN_2$.

Figure 11:
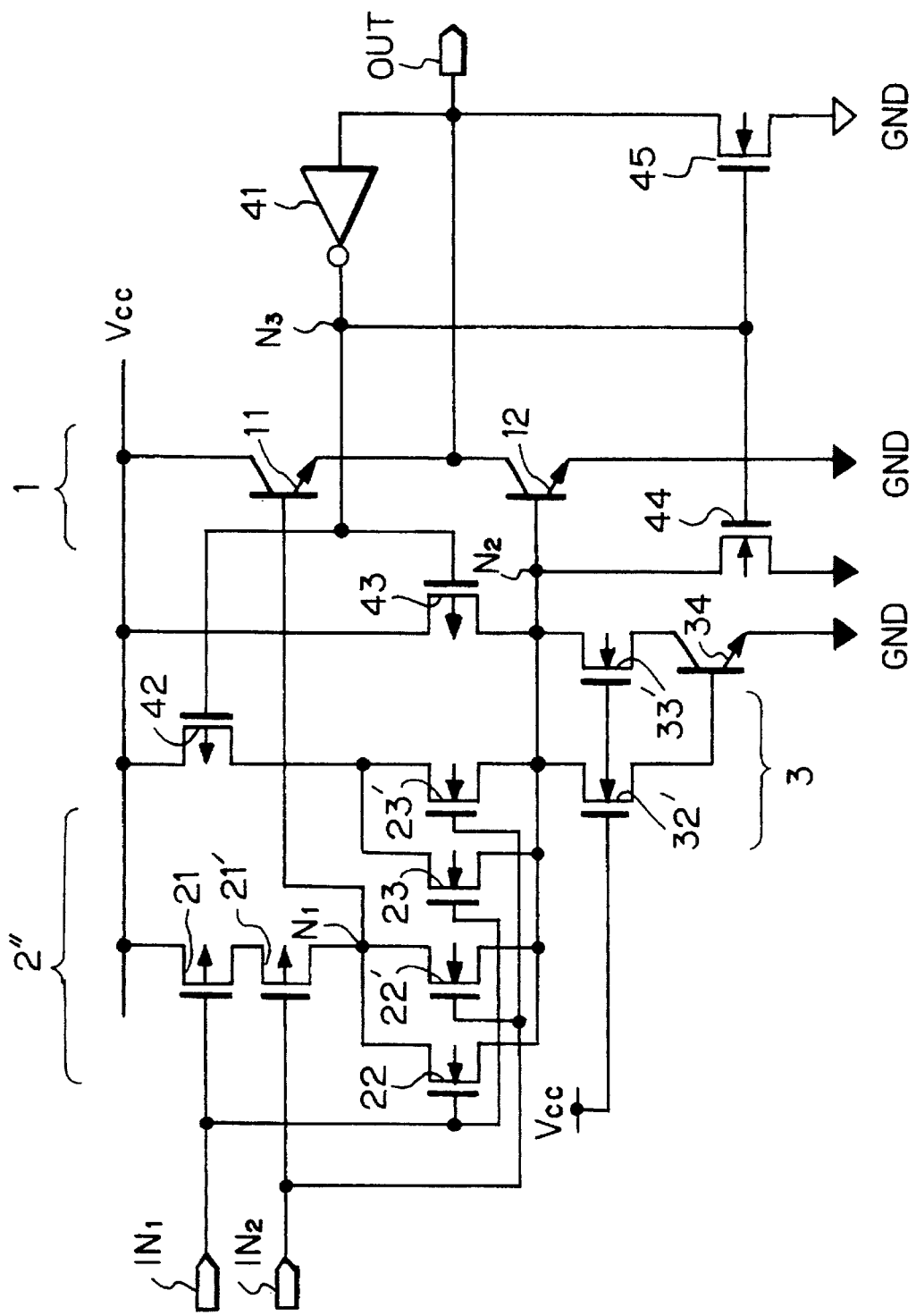
FIG. 11 is a circuit diagram illustrating a NOR logic apparatus to which the first embodiment of the present invention is applied.

FIG. 11 is a circuit diagram illustrating a NOR logic apparatus to which the first embodiment as illustrated in FIG. 8 is applied. That is, a CMOS control circuit 2" includes P-channel MOS transistors 21 and 21' in series between the power supply terminal $V_{cc}$ and the node $N_1$, N-channel MOS transistors 22 and 22' in parallel between the nodes $N_1$ and $N_2$, and N-channel MOS transistors 23 and 23' in parallel between the MOS transistor 42 and the node $N_2$. Also, the MOS transistors 21 to 23 are controlled by a voltage at an input terminal $IN_1$, and the MOS transistors 21' and 23' are controlled by a voltage at an input terminal $IN_2$.

Figure 12:
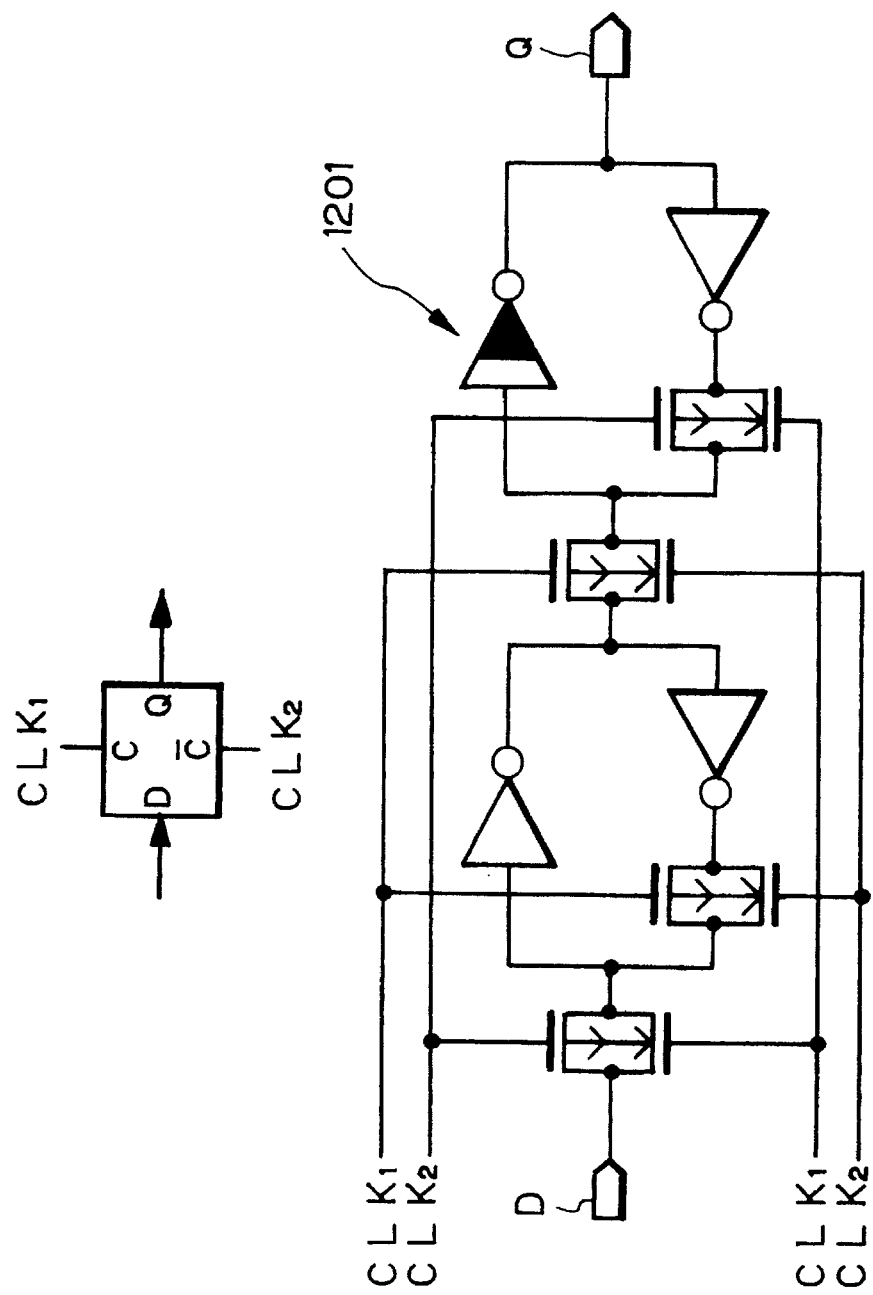
FIG. 12 is a circuit diagram illustrating a flip-flop logic apparatus to which the first embodiment of the resent invention is applied.

In FIG. 12, which illustrates a D type flip-flop, the first embodiment as illustrated in FIG. 5, 7A 7B, 7C or 8, or the second embodiment as illustrated in FIG. 9 can be applied to a CMOS inverter 1201.

In the above-described embodiments, although the bipolar transistors are of an NPN type, it is possible to use bipolar transistors of a PNP type.

As explained hereinbefore, according to the present invention, since the voltage clamp circuit is released in accordance with the voltage at the output terminal, the output voltage swing can be increased.

I claim:

1. A push-pull type logic apparatus comprising:
   an input terminal;
   an output terminal;
   a push-pull buffer, connected to said output terminal and formed by two bipolar transistors;
   a control circuit, connected between said input terminal and said push-pull buffer, for turning ON one of said bipolar transistors and turning OFF the other of said bipolar transistor in accordance with a voltage at said input terminal;
   a voltage clamp circuit, connected to one of the bases of said bipolar transistors, for clamping a voltage thereof at a forward voltage, said voltage clamp circuit having a higher impedance than a base input impedance of the same one of the bases of said bipolar transistors;
   a voltage detecting circuit, connected to said output terminal, for detecting a voltage at said output terminal;
   a clamp releasing circuit, connected to said voltage detecting circuit and said voltage clamp circuit, for releasing a clamp operation of said voltage clamp circuit in accordance with an output of said voltage detecting circuit.

2. A push-pull type logic apparatus, comprising:
   a first power supply terminal;
   a second power supply terminal;
   an output terminal;
   a first bipolar transistor connected between said first power supply terminal and said output terminal;
   a second bipolar transistor connected between said output terminal and said second power supply terminal;
   a control circuit, connected to bases of said first and second bipolar transistors, for turning ON one of said first and second bipolar transistors and turning OFF the other of said first and second bipolar transistors;
   a voltage clamp circuit, connected to the base of said second bipolar transistor, for clamping a voltage of the base of said second bipolar transistor at a forward voltage of said second bipolar transistor, said voltage clamp circuit having a higher impedance than an impedance between the base and emitter of said second bipolar transistor;
   a voltage detecting circuit, connected to said output terminal, for detecting a voltage of said output terminal;
   a clamp releasing circuit, connected between said voltage detecting circuit and said voltage clamp circuit for releasing a clamping operation of said voltage clamp circuit in accordance with an output of said voltage detecting circuit.

3. An apparatus as set forth in claim 2, further comprising a disabling circuit, connected between said voltage detecting circuit and the base of said second bipolar transistor, for disabling said second bipolar transistor in accordance with the output of said voltage detecting circuit.

4. An apparatus as set forth in claim 2, further comprising a switch, connected between said output terminal and a power supply terminal, for causing the voltage of said output terminal to be a voltage of said power supply terminal in accordance with the output of said voltage detecting circuit.

5. A push-pull type logic apparatus comprising:
   a high power supply terminal;
   a low power supply terminal;
   an input terminal;
   an output terminal;
   first, second and third nodes;
   a first NPN type transistor having a collector connected to said high power supply terminal, an emitter connected to said output terminal, and a base connected to said first node;
   a second NPN type transistor having a collector connected to said output terminal, an emitter connected to said low power supply terminal, and a base connected to said second node;
   a first P-channel MOS transistor connected between said high power supply terminal and said first node and having a gate connected to said input terminal;
   a first N-channel MOS transistor connected between said first node and said second node and having a gate connected to said input terminal;
   a voltage detecting circuit having an input connected to said output terminal and an output connected to said third node;
   a second P-channel MOS transistor having a source connected to said high power supply terminal, a drain, and a gate connected to said third node;
   a second N-channel MOS transistor connected between the drain of said second P-channel MOS transistor and said second node and having a gate connected to said input terminal;
   a third P-channel MOS transistor having a source connected to said high power supply terminal a drain connected to said second node, and a gate connected to said third node; and
   a voltage clamp circuit connected between said second node and said low power supply terminal.

6. An apparatus as set forth in claim 5, wherein said voltage detecting circuit comprises a CMOS inverter.

7. An apparatus as set forth in claim 5, wherein said voltage clamp circuit comprises:
   a first resistor means connected to said second node; and
   a third NPN transistor having a collector connected to said second node, an emitter connected to said low power supply terminal, and a base connected to said first resistor.

8. An apparatus as set forth in claim 7, wherein said first resistor means comprises an ON-state MOS transistor.

9. An apparatus as set forth in claim 7, wherein said voltage clamp circuit further comprises a second resistor means connected between said second node and the collector of said third NPN type transistor.

10. An apparatus as set forth in claim 9, wherein said second resistor means comprises an ON-state MOS transistor.

11. An apparatus as set forth in claim 7, wherein said voltage clamp circuit further comprises a capacitor connected between the base of said third NPN type transistor and said low power supply terminal.

12. An apparatus as set forth in claim 5, wherein said voltage clamp circuit comprises:
   a resistor means connected to said second node; and
   a third NPN transistor having a collector connected to said resistor, an emitter connected to said low power supply terminal, and a base connected to said second node.

13. An apparatus as set forth in claim 12, wherein said resistor means comprises an ON-state MOS transistor.

14. An apparatus as set forth in claim 12, wherein said voltage clamp circuit further comprises a capacitor connected between the base of said third NPN type transistor and said low power supply terminal.

15. An apparatus as set forth in claim 5, further comprising a third N-channel MOS transistor connected between said second node and said low power supply terminal and having a gate connected to said third node.

16. An apparatus as set forth in claim 5, further comprising a fourth N-channel MOS transistor connected between said output terminal and said low power supply terminal and having a gate connected to said third node.

17. A push-pull type logic apparatus comprising:

a high power supply terminal;

a low power supply terminal;

an input terminal;

an output terminal;

first, second third and fourth nodes;

a first NPN type transistor having a collector connected to said high power supply terminal, an emitter connected to said output terminal, and a base connected to said first node;

a second NPN type transistor having a collector connected to said output terminal, an emitter connected to said low power supply terminal, and a base connected to said fourth node;

a first P-channel MOS transistor connected between said high power supply terminal and said first node and having a gate connected to said input terminal;

a first N-channel MOS transistor connected between said first node and said second node and having a gate connected to said input terminal;

a voltage detecting circuit having an input connected to said output terminal and an output connected to said third node;

a second P-channel MOS transistor having a source connected to said high power supply terminal, a drain, and a gate connected to said third node;

a second N-channel MOS transistor connected between the drain of said second P-channel MOS transistor and said second node and having a gate connected to said input terminal;

a third P-channel MOS transistor having a source connected to said high power supply terminal, a drain connected to said second node, and a gate connected to said third node;

a first voltage clamp circuit connected between said second node and said low power supply terminal; and a second voltage clamp circuit connected to said fourth node and to said high and low power supply terminals.

18. An apparatus as set forth in claim 17, wherein said voltage detecting circuit comprises a CMOS inverter.

19. An apparatus as set forth in claim 5, wherein said first voltage clamp circuit comprises:

a first resistor means connected to said second node; and a third NPN transistor having a collector connected to said second node, an emitter connected to said low power supply terminal, and a base connected to said first resistor.

20. An apparatus as set forth in claim 19, wherein said first resistor means comprises an ON-state MOS transistor.

21. An apparatus as set forth in claim 19, wherein said first voltage clamp circuit further comprises a second resistor means connected between said second node and the collector of said third NPN type transistor.

22. An apparatus as set forth in claim 21, wherein said second resistor means comprises an ON-state MOS transistor.

23. An apparatus as set forth in claim 19, wherein said first voltage clamp circuit further comprises a capacitor connected between the base of said third NPN type transistor and said low power supply terminal.

24. An apparatus as set forth in claim 17, wherein said first voltage clamp circuit comprises:

a resistor means connected to said second node; and a third NPN transistor having a collector connected to said resistor, an emitter connected to said low power supply terminal, and a base connected to said second node.

25. An apparatus as set forth in claim 24, wherein said resistor means comprises an ON-state MOS transistor.

26. An apparatus as set forth in claim 24, wherein said first voltage clamp circuit further comprises a capacitor connected between the base of said third NPN type transistor and said low power supply terminal.

27. An apparatus as set forth in claim 17, further comprising a third N-channel MOS transistor connected between said second node and said low power supply terminal and having a gate connected to said third node.

28. An apparatus as set forth in claim 17, further comprising a fourth N-channel MOS transistor connected between said output terminal and said low power supply terminal and having a gate connected to said third node.

29. An apparatus as set forth in claim 17, wherein said second voltage clamp circuit comprises:

a third resistor means connected between said high power supply terminal and said forth node;

a fourth NPN type transistor having a collector, a base, and an emitter connected to said low power supply terminal;

a fourth resistor means connected between said fourth node and the base of said fourth NPN type transistor; and a fifth resistor means connected between said fourth node and the collector of said fourth NPN type transistor.

\* \* \* \* \*